United States Patent
Roeters et al.

(10) Patent No.: US 7,193,310 B2
(45) Date of Patent: *Mar. 20, 2007

(54) STACKING SYSTEM AND METHOD

(75) Inventors: Glen E Roeters, Huntington Beach, CA (US); Andrew C Ross, Ramona, CA (US)

(73) Assignee: Stuktek Group L.P., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/489,956

(22) Filed: Jul. 20, 2006

(65) Prior Publication Data

US 2006/0261461 A1    Nov. 23, 2006

Related U.S. Application Data

(63) Continuation of application No. 10/016,939, filed on Dec. 14, 2001, now Pat. No. 7,081,373.

(51) Int. Cl.
*H01L 23/02* (2006.01)

(52) U.S. Cl. .............................. 257/686; 257/E23.169

(58) Field of Classification Search ................ 438/109; 257/686

See application file for complete search history.

(56) References Cited

U.S. PATENT DOCUMENTS

| | | | |
|---|---|---|---|
| 3,372,310 A | 3/1968 | Kantor | |
| 3,411,122 A | 11/1968 | Schiller et al. | |
| 3,436,604 A | 4/1969 | Hyltin | |
| 3,654,394 A | 4/1972 | Gordon | |
| 3,704,455 A | 11/1972 | Scarbrough | |
| 3,718,842 A | 2/1973 | Abbott III, et al. | |

(Continued)

FOREIGN PATENT DOCUMENTS

DE    004215467 A1    11/1992

(Continued)

OTHER PUBLICATIONS

Flexible Printed Circuit Technology—A Versatile Interconnection Option. (Website 2 pages) Fjelstad, Joseph. Dec. 3, 2002.

(Continued)

*Primary Examiner*—David A. Zarneke
(74) *Attorney, Agent, or Firm*—J. Scott Denko; Fish & Richardson P.C.

(57) ABSTRACT

A chip stack comprising a flex circuit including a flex substrate having a first conductive pattern disposed thereon and a plurality of leads extending therefrom. Also included in the chip stack are at least two integrated circuit chip packages. The integrated circuit chip packages may be electrically connected to the first conductive pattern of the flex circuit such that the integrated circuit chip packages are positioned upon respective ones of opposed top and bottom surfaces of the flex substrate. Alternatively, one of the integrated circuit chip packages may be positioned upon the top surface of the flex substrate and electrically connected to the first conductive pattern, with the remaining integrated circuit chip package being attached in a non-conductive manner to the bottom surface of the flex substrate such that the conductive contacts of such integrated circuit chip package and the leads collectively define a composite footprint for the chip stack.

6 Claims, 1 Drawing Sheet

U.S. PATENT DOCUMENTS

| | | |
|---|---|---|
| 3,727,064 A | 4/1973 | Bottini |
| 3,746,934 A | 7/1973 | Stein |
| 3,766,439 A | 10/1973 | Isaacson |
| 3,772,776 A | 11/1973 | Weisenburger |
| 3,983,547 A | 9/1976 | Almasi |
| 4,079,511 A | 3/1978 | Grabbe |
| 4,103,318 A | 7/1978 | Schwede |
| 4,169,642 A | 10/1979 | Moulssie |
| 4,288,841 A | 9/1981 | Gogal |
| 4,342,069 A | 7/1982 | Link |
| 4,398,235 A | 8/1983 | Lutz et al. |
| 4,406,508 A | 9/1983 | Sadigh-Behzadi |
| 4,429,349 A | 1/1984 | Zachry |
| 4,437,235 A | 3/1984 | McIver |
| 4,513,368 A | 4/1985 | Houseman |
| 4,567,543 A | 1/1986 | Miniet |
| 4,587,596 A | 5/1986 | Bunnell |
| 4,645,944 A | 2/1987 | Uya |
| 4,656,605 A | 4/1987 | Clayton |
| 4,672,421 A | 6/1987 | Lin |
| 4,682,207 A | 7/1987 | Akasaki et al. |
| 4,696,525 A | 9/1987 | Coller et al. |
| 4,709,300 A | 11/1987 | Landis |
| 4,712,129 A | 12/1987 | Orcutt |
| 4,722,691 A | 2/1988 | Gladd et al. |
| 4,724,611 A | 2/1988 | Hagihara |
| 4,727,513 A | 2/1988 | Clayton |
| 4,733,461 A | 3/1988 | Nakano |
| 4,758,875 A | 7/1988 | Fujisawa et al. |
| 4,763,188 A | 8/1988 | Johnson |
| 4,821,007 A | 4/1989 | Fields et al. |
| 4,823,234 A | 4/1989 | Konishi et al. |
| 4,833,568 A | 5/1989 | Berhold |
| 4,839,717 A | 6/1989 | Phy et al. |
| 4,850,892 A | 7/1989 | Clayton et al. |
| 4,862,249 A | 8/1989 | Carlson |
| 4,884,237 A | 11/1989 | Mueller et al. |
| 4,891,789 A | 1/1990 | Quattrini et al. |
| 4,911,643 A | 3/1990 | Perry et al. |
| 4,953,060 A | 8/1990 | Lauffer et al. |
| 4,956,694 A | 9/1990 | Eide |
| 4,972,580 A | 11/1990 | Nakamura |
| 4,982,265 A | 1/1991 | Watanabe et al. |
| 4,983,533 A | 1/1991 | Go |
| 4,985,703 A | 1/1991 | Kaneyama |
| 4,992,849 A | 2/1991 | Corbett et al. |
| 4,992,850 A | 2/1991 | Corbett et al. |
| 5,012,323 A | 4/1991 | Farnworth |
| 5,014,115 A | 5/1991 | Moser |
| 5,014,161 A | 5/1991 | Lee et al. |
| 5,016,138 A | 5/1991 | Woodman |
| 5,025,306 A | 6/1991 | Johnson et al. |
| 5,034,350 A | 7/1991 | Marchisi |
| 5,041,015 A | 8/1991 | Travis |
| 5,041,902 A | 8/1991 | McShane |
| 5,053,853 A | 10/1991 | Haj-Ali-Ahmadi et al. |
| 5,057,903 A | 10/1991 | Olla |
| 5,064,762 A | 11/1991 | Nishiguchi |
| 5,065,277 A | 11/1991 | Davidson |
| 5,068,708 A | 11/1991 | Newman |
| 5,081,067 A | 1/1992 | Shimru et al. |
| 5,099,393 A | 3/1992 | Bentlage et al. |
| 5,104,820 A | 4/1992 | Go et al. |
| 5,109,318 A | 4/1992 | Funari et al. |
| 5,117,282 A | 5/1992 | Salatino |
| 5,119,269 A | 6/1992 | Nakayama |
| 5,122,862 A | 6/1992 | Kajihara et al. |
| 5,138,430 A | 8/1992 | Gow, 3rd et al. |
| 5,138,434 A | 8/1992 | Wood et al. |
| 5,140,405 A | 8/1992 | King et al. |
| 5,158,912 A | 10/1992 | Kellerman et al. |
| 5,159,434 A | 10/1992 | Kohno et al. |
| 5,159,535 A | 10/1992 | Desai et al. |
| 5,168,926 A | 12/1992 | Watson et al. |
| 5,173,840 A | 12/1992 | Kodai et al. |
| 5,191,404 A | 3/1993 | Wu et al. |
| 5,198,888 A | 3/1993 | Sugano et al. |
| 5,198,965 A | 3/1993 | Curtis et al. |
| 5,208,729 A | 5/1993 | Cipolla et al. |
| 5,214,307 A | 5/1993 | Davis |
| 5,219,377 A | 6/1993 | Poradish |
| 5,219,794 A | 6/1993 | Satoh et al. |
| 5,222,014 A | 6/1993 | Lin |
| 5,224,023 A | 6/1993 | Smith et al. |
| 5,229,916 A | 7/1993 | Frankeny et al. |
| 5,229,917 A | 7/1993 | Harris et al. |
| 5,239,198 A | 8/1993 | Lin et al. |
| 5,240,588 A | 8/1993 | Uchida |
| 5,241,454 A | 8/1993 | Ameen et al. |
| 5,241,456 A | 8/1993 | Marcinkiewiez et al. |
| 5,243,133 A | 9/1993 | Engle et al. |
| 5,247,423 A | 9/1993 | Lin et al. |
| 5,252,855 A | 10/1993 | Ogawa et al. |
| 5,252,857 A | 10/1993 | Kane et al. |
| 5,259,770 A | 11/1993 | Bates et al. |
| 5,261,068 A | 11/1993 | Gaskins et al. |
| 5,262,927 A | 11/1993 | Chia et al. |
| 5,268,815 A | 12/1993 | Cipolla et al. |
| 5,276,418 A | 1/1994 | Klosowiak et al. |
| 5,279,029 A | 1/1994 | Burns |
| 5,281,852 A | 1/1994 | Normington |
| 5,289,062 A | 2/1994 | Wyland |
| 5,311,401 A | 5/1994 | Gates, Jr. et al. |
| 5,313,097 A | 5/1994 | Haj-Ali-Ahmadi et al. |
| 5,343,075 A | 8/1994 | Nishino |
| 5,347,428 A | 9/1994 | Carson et al. |
| 5,357,478 A | 10/1994 | Kikuda et al. |
| 5,361,228 A | 11/1994 | Adachi et al. |
| 5,375,041 A | 12/1994 | McMahon |
| 5,377,077 A | 12/1994 | Burns |
| 5,386,341 A | 1/1995 | Olson et al. |
| 5,394,010 A | 2/1995 | Tazawa et al. |
| 5,394,300 A | 2/1995 | Yoshimura |
| 5,394,303 A | 2/1995 | Yamaji |
| 5,397,916 A | 3/1995 | Normington |
| 5,400,003 A | 3/1995 | Kledzik |
| 5,402,006 A | 3/1995 | O'Donley |
| 5,420,751 A | 5/1995 | Burns |
| 5,428,190 A | 6/1995 | Stopperan |
| 5,438,224 A | 8/1995 | Papageorge et al. |
| 5,446,620 A | 8/1995 | Burns et al. |
| 5,448,511 A | 9/1995 | Paurus et al. |
| 5,455,740 A | 10/1995 | Burns |
| 5,475,920 A | 12/1995 | Burns et al. |
| 5,477,082 A | 12/1995 | Buckley, III et al. |
| 5,479,318 A | 12/1995 | Burns |
| 5,484,959 A | 1/1996 | Burns |
| 5,491,612 A | 2/1996 | Nicewarner, Jr. et al. |
| 5,493,476 A | 2/1996 | Burns |
| 5,499,160 A | 3/1996 | Burns |
| 5,502,333 A | 3/1996 | Bertin et al. |
| 5,514,907 A | 5/1996 | Moshayedi |
| 5,523,619 A | 6/1996 | McAllister et al. |
| 5,523,695 A | 6/1996 | Lin |
| 5,541,812 A | 7/1996 | Burns |
| 5,543,664 A | 8/1996 | Burns |
| 5,561,591 A | 10/1996 | Burns |
| 5,566,051 A | 10/1996 | Burns |
| 5,572,065 A | 11/1996 | Burns |
| 5,588,205 A | 12/1996 | Roane |
| 5,592,364 A | 1/1997 | Roane |
| 5,594,275 A | 1/1997 | Kwon et al. |
| 5,600,178 A | 2/1997 | Russell |
| 5,612,570 A | 3/1997 | Eide et al. |

| | | | | | | |
|---|---|---|---|---|---|---|
| 5,631,193 | A | 5/1997 | Burns | 6,180,881 B1 | 1/2001 | Isaak |
| 5,642,055 | A | 6/1997 | Difrancesco | 6,187,652 B1 | 2/2001 | Chou et al. |
| 5,644,161 | A | 7/1997 | Burns | 6,205,654 B1 | 3/2001 | Burns |
| 5,646,446 | A | 7/1997 | Nicewarner, Jr. et al. | 6,208,521 B1 | 3/2001 | Nakatsuka |
| 5,654,877 | A | 8/1997 | Burns | 6,208,546 B1 | 3/2001 | Ikeda |
| 5,657,537 | A | 8/1997 | Saia et al. | 6,214,641 B1 | 4/2001 | Akram |
| 5,661,339 | A | 8/1997 | Clayton | 6,215,181 B1 | 4/2001 | Akram et al. |
| 5,677,569 | A | 10/1997 | Choi et al. | 6,215,687 B1 | 4/2001 | Sugano et al. |
| 5,686,730 | A | 11/1997 | Laudon et al. | 6,218,731 B1 | 4/2001 | Huang et al. |
| 5,708,297 | A | 1/1998 | Clayton | 6,222,737 B1 | 4/2001 | Ross |
| 5,714,802 | A | 2/1998 | Cloud et al. | 6,222,739 B1 | 4/2001 | Bhakta et al. |
| 5,729,894 | A | 3/1998 | Rostoker et al. | 6,225,688 B1 | 5/2001 | Kim et al. |
| 5,731,633 | A | 3/1998 | Clayton | 6,232,659 B1 | 5/2001 | Clayton |
| 5,744,827 | A | 4/1998 | Jeong et al. | 6,233,650 B1 | 5/2001 | Johnson et al. |
| 5,744,862 | A | 4/1998 | Ishii | 6,234,820 B1 | 5/2001 | Perino et al. |
| 5,751,553 | A | 5/1998 | Clayton | 6,262,476 B1 | 7/2001 | Vidal |
| 5,754,409 | A | 5/1998 | Smith | 6,262,895 B1 | 7/2001 | Forthun |
| 5,763,296 | A | 6/1998 | Casati et al. | 6,265,660 B1 | 7/2001 | Tandy |
| 5,764,497 | A | 6/1998 | Mizumo et al. | 6,265,766 B1 | 7/2001 | Moden |
| 5,776,797 | A | 7/1998 | Nicewarner, Jr. et al. | 6,266,252 B1 | 7/2001 | Karabatsos |
| 5,778,522 | A | 7/1998 | Burns | 6,281,577 B1 | 8/2001 | Oppermann et al. |
| 5,778,552 | A | 7/1998 | LeGuin | 6,285,560 B1 | 9/2001 | Lyne |
| 5,783,464 | A | 7/1998 | Burns | 6,288,907 B1 | 9/2001 | Burns |
| 5,789,815 | A | 8/1998 | Tessier et al. | 6,288,924 B1 | 9/2001 | Sugano et al. |
| 5,790,447 | A | 8/1998 | Laudon et al. | 6,300,679 B1 | 10/2001 | Mukerji et al. |
| 5,801,437 | A | 9/1998 | Burns | 6,303,981 B1 | 10/2001 | Moden |
| 5,801,439 | A | 9/1998 | Fujisawa et al. | 6,310,392 B1 | 10/2001 | Burns |
| 5,802,395 | A | 9/1998 | Connolly et al. | 6,313,998 B1 | 11/2001 | Kledzik |
| 5,804,870 | A | 9/1998 | Burns | 6,316,825 B1 | 11/2001 | Park et al. |
| 5,805,422 | A | 9/1998 | Otake et al. | 6,323,060 B1 | 11/2001 | Isaak |
| 5,828,125 | A | 10/1998 | Burns | 6,329,708 B1 | 12/2001 | Komiyama |
| 5,835,988 | A | 11/1998 | Ishii | 6,336,262 B1 | 1/2002 | Dalal et al. |
| 5,841,721 | A | 11/1998 | Kwon et al. | 6,343,020 B1 | 1/2002 | Lin et al. |
| 5,869,353 | A | 2/1999 | Levy et al. | 6,347,394 B1 | 2/2002 | Ochoa et al. |
| 5,895,970 | A | 4/1999 | Miyoshi et al. | 6,349,050 B1 | 2/2002 | Woo et al. |
| 5,899,705 | A | 5/1999 | Akram | 6,351,029 B1 | 2/2002 | Isaak |
| 5,917,709 | A | 6/1999 | Johnson et al. | 6,360,433 B1 | 3/2002 | Ross |
| 5,922,061 | A | 7/1999 | Robinson | 6,368,896 B2 | 4/2002 | Farnworth et al. |
| 5,925,934 | A | 7/1999 | Lim | 6,370,668 B1 | 4/2002 | Garrett, Jr. et al. |
| 5,926,369 | A | 7/1999 | Ingraham et al. | 6,376,769 B1 | 4/2002 | Chung |
| 5,949,657 | A | 9/1999 | Karabatsos | 6,392,162 B1 | 5/2002 | Karabatsos |
| 5,953,214 | A | 9/1999 | Dranchak et al. | 6,404,043 B1 | 6/2002 | Isaak |
| 5,953,215 | A | 9/1999 | Karabatsos | 6,410,857 B1 | 6/2002 | Gonya |
| 5,959,839 | A | 9/1999 | Gates | 6,423,622 B1 | 7/2002 | Chen et al. |
| 5,963,427 | A | 10/1999 | Bollesen | 6,426,240 B2 | 7/2002 | Isaak |
| 5,973,395 | A | 10/1999 | Suzuki et al. | 6,426,549 B1 | 7/2002 | Isaak |
| 5,995,370 | A | 11/1999 | Nakamori | 6,426,560 B1 | 7/2002 | Kawamura et al. |
| 6,002,167 | A | 12/1999 | Hatano et al. | 6,428,360 B2 | 8/2002 | Hassanzadeh et al. |
| 6,002,589 | A | 12/1999 | Perino et al. | 6,433,418 B1 | 8/2002 | Fujisawa et al. |
| 6,008,538 | A | 12/1999 | Akram et al. | 6,444,490 B2 | 9/2002 | Bertin et al. |
| 6,014,316 | A | 1/2000 | Eide | 6,444,921 B1 | 9/2002 | Wang et al. |
| 6,021,048 | A | 2/2000 | Smith | 6,446,158 B1 | 9/2002 | Karabatsos |
| 6,025,642 | A | 2/2000 | Burns | 6,449,159 B1 | 9/2002 | Haba |
| 6,028,352 | A | 2/2000 | Eide | 6,452,826 B1 | 9/2002 | Kim et al. |
| 6,028,365 | A | 2/2000 | Akram et al. | 6,462,412 B2 | 10/2002 | Kamei et al. |
| 6,034,878 | A | 3/2000 | Osaka et al. | 6,462,423 B1 | 10/2002 | Akram et al. |
| 6,038,132 | A | 3/2000 | Tokunaga et al. | 6,465,877 B1 | 10/2002 | Farnworth et al. |
| 6,040,624 | A | 3/2000 | Chambers et al. | 6,465,893 B1 | 10/2002 | Khandros et al. |
| 6,049,975 | A | 4/2000 | Clayton | 6,472,735 B2 | 10/2002 | Isaak |
| 6,060,339 | A | 5/2000 | Akram et al. | 6,473,308 B2 | 10/2002 | Forthun |
| 6,072,233 | A | 6/2000 | Corisis et al. | 6,486,544 B1 | 11/2002 | Hashimoto |
| 6,078,515 | A | 6/2000 | Nielsen et al. | 6,489,178 B2 | 12/2002 | Coyle et al. |
| 6,084,293 | A | 7/2000 | Ohuchi | 6,489,687 B1 | 12/2002 | Hashimoto |
| 6,084,294 | A | 7/2000 | Tomita | 6,492,718 B2 | 12/2002 | Ohmori |
| 6,091,145 | A | 7/2000 | Clayton | 6,502,161 B1 | 12/2002 | Perego et al. |
| 6,097,087 | A | 8/2000 | Farnworth et al. | 6,509,639 B1 | 1/2003 | Lin |
| 6,111,757 | A | 8/2000 | Dell et al. | 6,514,793 B2 | 2/2003 | Isaak |
| 6,121,676 | A | 9/2000 | Solberg | 6,528,870 B2 | 3/2003 | Fukatsu et al. |
| RE36,916 | E | 10/2000 | Moshayedi | 6,531,772 B2 | 3/2003 | Akram et al. |
| 6,157,541 | A | 12/2000 | Hacke | 6,532,162 B2 | 3/2003 | Schoenborn |
| 6,165,817 | A | 12/2000 | Akram | 6,544,815 B2 | 4/2003 | Isaak |
| 6,172,874 | B1 | 1/2001 | Bartilson | 6,549,413 B2 | 4/2003 | Karnezos et al. |
| 6,178,093 | B1 | 1/2001 | Bhatt et al. | 6,552,910 B1 | 4/2003 | Moon et al. |

| | | |
|---|---|---|
| 6,552,948 B2 | 4/2003 | Woo et al. |
| 6,560,117 B2 | 5/2003 | Moon |
| 6,566,746 B2 | 5/2003 | Isaak et al. |
| 6,572,387 B2 | 6/2003 | Burns et al. |
| 6,573,593 B1 | 6/2003 | Syri et al. |
| 6,576,992 B1 | 6/2003 | Cady et al. |
| 6,588,095 B2 | 7/2003 | Pan |
| 6,590,282 B1 | 7/2003 | Wang et al. |
| 6,600,222 B1 | 7/2003 | Levardo |
| 6,614,664 B2 | 9/2003 | Lee |
| 6,620,651 B2 | 9/2003 | He et al. |
| 6,627,984 B2 | 9/2003 | Bruce et al. |
| 6,629,855 B1 | 10/2003 | North et al. |
| 6,646,936 B2 | 11/2003 | Hamamatsu et al. |
| 6,657,134 B2 | 12/2003 | Spielberger et al. |
| 6,660,561 B2 | 12/2003 | Forthun |
| 6,661,092 B2 | 12/2003 | Shibata et al. |
| 6,677,670 B2 | 1/2004 | Kondo |
| 6,683,377 B1 | 1/2004 | Shim et al. |
| 6,690,584 B2 | 2/2004 | Uzuka et al. |
| 6,699,730 B2 | 3/2004 | Kim et al. |
| 6,707,684 B1 | 3/2004 | Andric et al. |
| 6,709,893 B2 | 3/2004 | Moden et al. |
| 6,720,652 B2 | 4/2004 | Akram et al. |
| 6,721,185 B2 | 4/2004 | Dong et al. |
| 6,721,226 B2 | 4/2004 | Woo et al. |
| 6,724,076 B1 | 4/2004 | Kahlisch et al. |
| 6,744,656 B2 | 6/2004 | Sugano et al. |
| 6,751,113 B2 | 6/2004 | Bhakta et al. |
| 6,756,661 B2 | 6/2004 | Tsuneda et al. |
| 6,760,220 B2 | 7/2004 | Canter et al. |
| 6,768,660 B2 | 7/2004 | Kong et al. |
| 6,781,240 B2 | 8/2004 | Choi et al. |
| 6,803,651 B1 | 10/2004 | Chiang |
| 6,812,567 B2 | 11/2004 | Kim et al. |
| 6,833,981 B2 | 12/2004 | Suwabe et al. |
| 6,833,984 B1 | 12/2004 | Belgacem |
| 6,839,266 B1 | 1/2005 | Garrett, Jr. et al. |
| 6,841,868 B2 | 1/2005 | Akram et al. |
| 6,849,949 B1 | 2/2005 | Lyu et al. |
| 6,850,414 B2 | 2/2005 | Benisek et al. |
| 6,873,534 B2 | 3/2005 | Bhakta et al. |
| 6,876,074 B2 | 4/2005 | Kim |
| 6,878,571 B2 | 4/2005 | Isaak et al. |
| 6,884,653 B2 | 4/2005 | Larson |
| 6,891,729 B2 | 5/2005 | Ko et al. |
| 6,908,792 B2 | 6/2005 | Bruce et al. |
| 6,914,324 B2 | 7/2005 | Rapport et al. |
| 6,919,626 B2 | 7/2005 | Burns |
| 7,081,373 B2 * | 7/2006 | Roeters et al. .............. 438/109 |
| 2001/0001085 A1 | 5/2001 | Hassanzadeh et al. |
| 2001/0006252 A1 | 7/2001 | Kim et al. |
| 2001/0013423 A1 | 8/2001 | Dalal et al. |
| 2001/0015487 A1 | 8/2001 | Forthun |
| 2001/0026009 A1 | 10/2001 | Tsuneda et al. |
| 2001/0028588 A1 | 10/2001 | Yamada et al. |
| 2001/0035572 A1 | 11/2001 | Isaak |
| 2001/0040793 A1 | 11/2001 | Inaba |
| 2001/0052637 A1 | 12/2001 | Akram et al. |
| 2002/0001216 A1 | 1/2002 | Sugano et al. |
| 2002/0006032 A1 | 1/2002 | Karabatsos |
| 2002/0030995 A1 | 3/2002 | Shoji |
| 2002/0048849 A1 | 4/2002 | Isaak |
| 2002/0076919 A1 | 6/2002 | Peters et al. |
| 2002/0094603 A1 | 7/2002 | Isaak |
| 2002/0101261 A1 | 8/2002 | Karabatsos |
| 2002/0139577 A1 | 10/2002 | Miller |
| 2002/0164838 A1 | 11/2002 | Moon et al. |
| 2002/0180022 A1 | 12/2002 | Emoto |
| 2002/0185731 A1 | 12/2002 | Akram et al. |
| 2002/0196612 A1 | 12/2002 | Gall et al. |
| 2003/0002262 A1 | 1/2003 | Benisek et al. |
| 2003/0016710 A1 | 1/2003 | Kamoto |
| 2003/0026155 A1 | 2/2003 | Yamagata |
| 2003/0035328 A1 | 2/2003 | Hamamatsu et al. |
| 2003/0045025 A1 | 3/2003 | Coyle et al. |
| 2003/0049886 A1 | 3/2003 | Salmon |
| 2003/0064548 A1 | 4/2003 | Isaak |
| 2003/0081387 A1 | 5/2003 | Schulz |
| 2003/0081392 A1 | 5/2003 | Cady et al. |
| 2003/0089978 A1 | 5/2003 | Miyamoto et al. |
| 2003/0090879 A1 | 5/2003 | Doblar et al. |
| 2003/0096497 A1 | 5/2003 | Moore et al. |
| 2003/0107118 A1 | 6/2003 | Pflughaupt et al. |
| 2003/0109078 A1 | 6/2003 | Takahashi et al. |
| 2003/0116835 A1 | 6/2003 | Miyamoto et al. |
| 2003/0159278 A1 | 8/2003 | Peddle |
| 2003/0168725 A1 | 9/2003 | Warner et al. |
| 2004/0000708 A1 | 1/2004 | Rapport et al. |
| 2004/0004281 A1 | 1/2004 | Bai et al. |
| 2004/0012991 A1 | 1/2004 | Kozaru |
| 2004/0021211 A1 | 2/2004 | Damberg |
| 2004/0031972 A1 | 2/2004 | Pflughaupt et al. |
| 2004/0045159 A1 | 3/2004 | DiStefano et al. |
| 2004/0065963 A1 | 4/2004 | Kamezos |
| 2004/0075991 A1 | 4/2004 | Haba et al. |
| 2004/0099938 A1 | 5/2004 | Kang et al. |
| 2004/0104470 A1 | 6/2004 | Bang et al. |
| 2004/0115866 A1 | 6/2004 | Bang et al. |
| 2004/0150107 A1 | 8/2004 | Cha et al. |
| 2004/0157352 A1 | 8/2004 | Beroz et al. |
| 2004/0203190 A1 | 10/2004 | Pflughaupt et al. |
| 2004/0217461 A1 | 11/2004 | Damberg |
| 2004/0217471 A1 | 11/2004 | Haba |
| 2004/0238931 A1 | 12/2004 | Haba et al. |
| 2004/0245617 A1 | 12/2004 | Damberg et al. |
| 2005/0018495 A1 | 1/2005 | Bhakta et al. |
| 2005/0035440 A1 | 2/2005 | Mohammed |
| 2005/0040508 A1 | 2/2005 | Lee |
| 2005/0104209 A1 | 5/2005 | Kang |
| 2005/0108468 A1 | 5/2005 | Hazelzet et al. |
| 2005/0133897 A1 | 6/2005 | Baek et al. |

FOREIGN PATENT DOCUMENTS

| | | |
|---|---|---|
| DE | 004214102 A1 | 12/1992 |
| EP | 0426-303 (A2) | 10/1990 |
| JP | 359088863 (A) | 5/1984 |
| JP | 60-254762 (A) | 12/1985 |
| JP | 3641047659 (A) | 3/1986 |
| JP | 62-230027 (A) | 8/1987 |
| JP | 4-209562 (A) | 7/1992 |
| JP | 4-4368167 (A) | 12/1992 |
| JP | 50-29534 (A) | 2/1993 |
| JP | 63-153849 (A) | 6/1998 |
| JP | 2000-88921 (A) | 3/2000 |
| JP | 2000/307029 (A) | 11/2000 |
| JP | 2001/077294 (A) | 3/2001 |
| JP | 2001/085592 (A) | 3/2001 |
| JP | 2001/332683 (A) | 11/2001 |
| JP | 2003/037246 (A) | 2/2003 |
| JP | 2003/086760 (A) | 3/2003 |
| JP | 2003/086761 (A) | 3/2003 |
| JP | 2003/309246 (A) | 10/2003 |
| JP | 2003/309247 (A) | 10/2003 |
| JP | 2003/347475 (A) | 12/2003 |
| JP | 2003/347503 (A) | 12/2003 |
| JP | 3602000 (B2) | 10/2004 |
| WO | WO 03/037053 A1 | 5/2003 |

OTHER PUBLICATIONS

Die Products: Ideal IC Packaging for Demanding Applications—Advanced packaging that's no bigger than the die itself brings together high performance and high reliability with small size and low cost. (Website 3 pages with 2 figures) Larry Gilg and Chris Windsor. Dec. 23, 2002. Published on Internet.

Tessera uZ Ball Stack Package. 4 figures that purport to be directed to the uZ—Ball Stacked Memory, Published on the Internet.

Chip Scale Review Online—An Independent Journal Dedicated to the Advancement of Chip-Scale Electronics. (Webiste 9 pages) Fjelstad, Joseph, Pacific Consultants L.L.C., Published Jan. 2001 on Internet.

Flexible Thinking: Examining the Flexible Circuit Tapes. (Website 2 pages) Fjelstad, Joseph., Published Apr. 20, 2000 on Internet.

Ron Bauer, Intel. "Stacked-CSP Delivers Flexibility, Reliability, and Space-Saving Capabilities", vol. 3, Spring 2002. Published on the Internet.

Tessera Technologies, Inc.—Semiconductor Intellectual Property, Chip Scale Packaging—Website pp. (3), Internet.

Tessera Introduces uZ ā—Ball Stacked Memory Package for Computing and Portable Electronic Products Joyce Smaragdis, Tessera Public Relations, Sandy Skees, MCA PR (www.tessera.com/news_events/press_coverage.cfm); 2 figures that purport to be directed to the uZ ā—Ball Stacked Memory Package. Published Jul. 17, 2002 in San Jose, CA.

William R. Newberry, Design Techniques for Ball Grid Arrays, Xynetix Design Systems, Inc., Portland, Maine, Published on the Internet.

Chip Scale Packaging and Redistribution, Paul A. Magill, Glenn A. Rinne, J. Daniel Mis, Wayne C. Machon, Joseph W. Baggs, Unitive Electronics Inc.

Dense-Pac Microsystems, 16 Megabit High Speed CMOS SRAM DPS1MX16MKn3.

Dense-Pac Microsystems, 256 Megabyte CMOS DRAM DP3ED32MS72RW5.

Dense-Pac Microsystems, Breaking Space Barriers, 3-D Technology 1993.

Dense-Pac Microsystems, DPS5122X16A3, Ceramic 512K X 16 CMOS SRAM Module.

IBM Preliminary 168 Pin SDRAM Registered DIMM Functional Description & Timing Diagrams.

3D Interconnection for Ultra-Dense Multichip Modules, Christian VAL, Thomson-CSF DCS Computer Division, Thierry Lemoine, Thomson-CSF RCM Radar Countermeasures Division.

High Density Memory Packaging Technology High Speed Imaging Applications, Dean Frew, Texas Instruments Incorporated.

Vertically-Intergrated Package, Alvin Weinberg, Pacesetter, Inc. and W. Kinzy Jones, Florida International University.

1992 Proceedings, 42nd Electronic Components & Technology Conference, May 18-20, 1992.

IMB Technical Disclosure Bulletin, vol. 23, No. 12, May 1981.

IBM Technical Disclosure Bulletin, vol. 20, No. 11A, Apr. 1978.

IBM Technical Disclosure Bulletin, vol. 32, No. 3B, Aug. 1989.

Orthogonal Chip Mount—A 3D Hybrid Wafer Scale Integration Technology, International Electron Device Meeting, IEDM Technical Digest, Washington, D.C., Dec. 6-9, 1987.

Research Disclosure, Organic Card Device Carrier, 31318, May 1990, No 313.

* cited by examiner

STACKING SYSTEM AND METHOD

This application is a continuation of U.S. application Ser. No. 10/016,939, filed on Dec. 14, 2001 now U.S. Pat. No. 7,081,373, the disclosure of the prior application is considered part of (and is incorporated by reference in) the disclosure of this application.

TECHNICAL FIELD

This invention relates to aggregation of integrated circuitry, and more particularly to stacking integrated circuitry.

BACKGROUND OF THE INVENTION

The present invention relates generally to chip stacks, and more particularly to a chip stack having connections routed from the bottom to the perimeter thereof to allow multiple integrated circuit chips such as CSP devices to be quickly, easily and inexpensively vertically interconnected in a volumetrically efficient manner.

Multiple techniques are currently employed in the prior art to increase memory capacity on a printed circuit board. Such techniques include the use of larger memory chips, if available, and increasing the size of the circuit board for purposes of allowing the same to accommodate more memory devices or chips. In another technique, vertical plug-in boards are used to increase the height of the circuit board to allow the same to accommodate additional memory devices or chips.

Perhaps one of the most commonly used techniques to increase memory capacity is the stacking of memory devices into a vertical chip stack, sometimes referred to as 3D packaging or Z-Stacking. In the Z-Stacking process, from two (2) to as many as eight (8) memory devices or other integrated circuit (IC) chips are interconnected in a single component (i.e., chip stack) which is mountable to the "footprint" typically used for a single package device such as a packaged chip. The Z-Stacking process has been found to be volumetrically efficient, with packaged chips in TSOP (thin small outline package) or LCC (leadless chip carrier) form generally being considered to be the easiest to use in relation thereto. Though bare dies or chips may also be used in the Z-Stacking process, such use tends to make the stacking process more complex and not well suited to automation.

In the Z-Stacking process, the IC chips or packaged chips must, in addition to being formed into a stack, be electrically interconnected to each other in a desired manner. There is known in the prior art various different arrangements and techniques for electrically interconnecting the IC chips or packaged chips within a stack. Examples of such arrangements and techniques are disclosed in Applicant's U.S. Pat. No. 4,956,694 entitled INTEGRATED CIRCUIT CHIP STACKING issued Sep. 11, 1990, U.S. Pat. No. 5,612,570 entitled CHIP STACK AND METHOD OF MAKING SAME issued Mar. 18, 1997, and U.S. Pat. No. 5,869,353 entitled MODULAR PANEL STACKING PROCESS issued Feb. 9, 1999.

The various arrangements and techniques described in these issued patents and other currently pending patent applications of Applicant have been found to provide chip stacks which are relatively easy and inexpensive to manufacture, and are well suited for use in a multitude of differing applications. The present invention provides yet a further alternative arrangement and technique for forming a volumetrically efficient chip stack. In the chip stack of the present invention, connections are routed from the bottom of the chip stack to the perimeter thereof so that interconnections can be made vertically which allows multiple integrated circuit chips such as BGA, CSP, fine pitch BGA, or flip chip devices to be stacked in a manner providing the potential for significant increases in the production rate of the chip stack and resultant reductions in the cost thereof.

BRIEF SUMMARY OF THE INVENTION

In accordance with one embodiment of the present invention, there is provided a chip stack comprising a flex circuit. The flex circuit itself comprises a flex substrate having a first conductive pattern disposed thereon, and a plurality of leads extending therefrom. The leads of the flex circuit are electrically connected to the first conductive pattern thereof. In addition to the flex circuit, the chip stack comprises at least two integrated circuit chip packages which are electrically connected to the first conductive pattern. The first conductive pattern comprises first and second sets of flex pads which are disposed on respective ones of the opposed top and bottom surfaces of the flex substrate, with one of the integrated circuit chip packages being disposed on the top surface of the flex substrate and electrically connected to at least some of the flex pads of the first set, and one of the integrated circuit chips being disposed upon the bottom surface of the flex substrate and electrically connected to at least some of the flex pads of the second set. The integrated circuit chip packages may each comprise a CSP device.

In accordance with another embodiment of the present invention, there is provided a chip stack comprising a flex circuit. The flex circuit itself comprises a flex substrate having a first conductive pattern disposed thereon, and a plurality of conductive leads extending therefrom. The leads of the flex circuit are electrically connected to the first conductive pattern thereon. The chip stack further comprises at least two integrated circuit chip packages, one of which is electrically connected to the first conductive pattern, with the remaining integrated circuit chip package being in non-conductive attachment to the flex substrate. The first conductive pattern of the flex circuit comprises a first set of flex pads disposed on the top surface of the flex substrate and electrically connected to respective ones of the leads. One of the integrated circuit chip packages is disposed upon the top surface of the flex substrate and electrically connected to at least some of the flex pads of the first set, with the remaining integrated circuit chip package being attached to the bottom surface of the flex substrate. The conductive contacts of the integrated circuit chip package attached to the bottom surface of the flex substrate and the leads of the flex circuit collectively define a composite footprint of the chip stack which is electrically connectable to another component. The leads of the chip stack may each comprise either an S-lead or a J-lead.

BRIEF DESCRIPTION OF THE DRAWINGS

These, as well as other features of the present invention, will become more apparent upon reference to the drawings wherein.

DETAILED DESCRIPTION OF THE INVENTION

Figure 1:
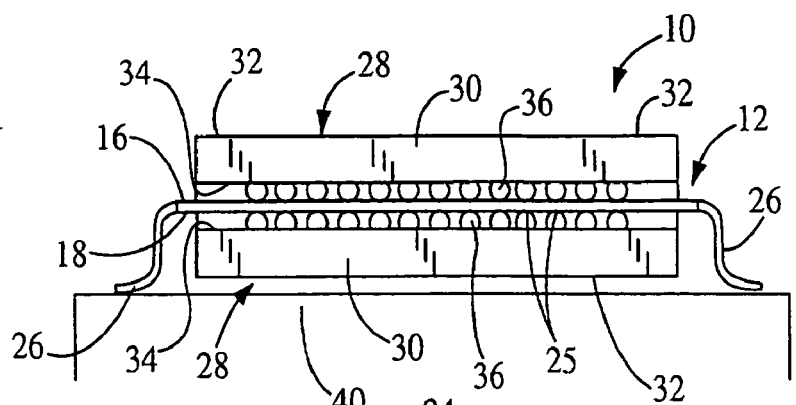
FIG. 1 is a side-elevational view of a chip stack constructed in accordance with a first embodiment of the present invention.
Figure 2:
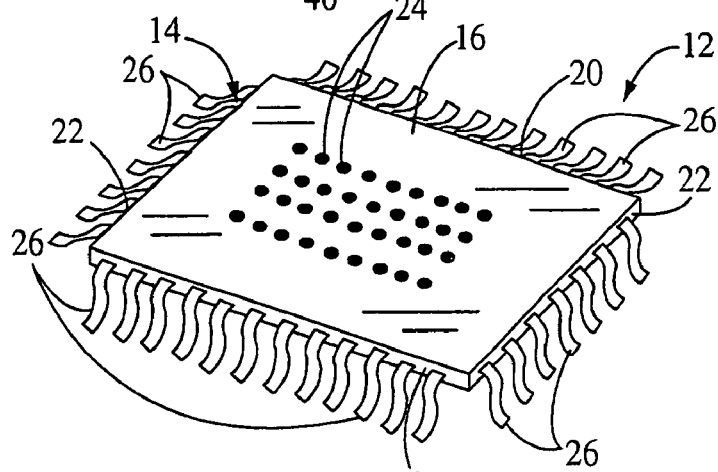
FIG. 2 is a top perspective view of the flex circuit included in the chip stack shown in FIG. 1.

Referring now to the drawings wherein the showings are for purposes of illustrating preferred embodiments of the present invention only, and not for purposes of limiting the same, FIG. 1 depicts a chip stack 10 constructed in accordance with a first embodiment of the present invention. Referring now to FIGS. 1 and 2, the chip stack 10 comprises a flex circuit 12. The flex circuit 12 itself comprises a rectangularly configured flex substrate 14 which defines a generally planar top surface 16, a generally planar bottom surface 18, an opposed pair of longitudinal peripheral edge segments 20, and an opposed pair of lateral peripheral edge segments 22.

Disposed on the flex substrate 14 of the flex circuit 12 is a first conductive pattern. The first conductive pattern itself preferably comprises a first set of flex pads 24 which are disposed on the top surface 16 of the flex substrate 14, and a second set of flex pads 25 which are disposed on the bottom surface 18 of the flex substrate 14. The flex pads 24 of the first set are arranged in a generally rectangular pattern or array in the central portion of the top surface 16. Likewise, the flex pads 25 of the second set are arranged in a generally rectangular pattern or array in the central portion of the bottom surface 18. It is contemplated that the flex pads 24 of the first set and the flex pads 25 of the second set will be arranged in identical patterns, with each of the flex pads 24 of the first set being coaxially aligned with a respective one of the flex pads 25 of the second set. However, those of ordinary skill in the art will recognize that the flex pads 24 of the first set and the flex pads 25 of the second set may be disposed upon the flex substrate 14 in dissimilar patterns. Additionally, though the flex substrate 14 is described as being rectangularly configured, it will be recognized that the same may be formed in alternative shapes (e.g., square).

Extending from one or more of the longitudinal and lateral peripheral edge segments 20, 22 of the flex substrate 14 are a plurality of conductive leads 26. The leads 26 each comprise an S-lead (i.e., gull wing) having the general shape of the letter S. Each of the leads 26 are electrically connected to the first conductive pattern and, in particular, to the flex pads 24, 25 of the first and second sets. The first conductive pattern of the flex circuit 12 may be configured such that the flex pads 24 of the first set and the flex pads 25 of the second set are each electrically connected to respective ones of the leads 26. It is also contemplated that two or more flex pads 24 of the first set may be electrically connected to a single lead 26, and that two or more flex pads 25 of the second set may be electrically connected to a single lead 26. Still further, one or more flex pads 24 of the first set in combination with one or more flex pads 25 of the second set may be electrically connected to a single lead 26. In this regard, the first conductive pattern may include conductive traces which extend within the flex substrate 14 in any pattern or arrangement as is needed to achieve a desired signal routing. Any flex pad 24 of the first set may be electrically connected to the flex pad 25 of the second set coaxially aligned therewith by a via or feed-through hole extending through the flex substrate 14 therebetween.

In the chip stack 10, the flex pads 24 of the first set, the flex pads 25 of the second set, and the conductive traces extending within the flex substrate 14 are each preferably fabricated from very thin copper having a thickness in the range of from about five microns to about twenty-five microns through the use of conventional etching techniques. The use of thin copper for the various pads and traces allows for etching line widths and spacings down to a pitch of about four mils which substantially increases the routing density of the flex circuit 12. The flex substrate 14 is preferably fabricated from either FR-4, a polyimide film, or some other suitable material which can easily be routed. The material used to form the flex substrate 14 may be as thin as about fifty microns or may be a thicker multi-layer structure.

The chip stack 10 further comprises at least two identically configured integrated circuit chip packages 28. Each of the integrated circuit chip packages 28 comprises a rectangularly configured package body 30 defining a generally planar top surface 32, a generally planar bottom surface 34, an opposed pair of longitudinal sides, and an opposed pair of lateral sides. Disposed on the bottom surface 34 of the package body 30 are a plurality of spherically or semi-spherically shaped conductive contacts 36 which are preferably arranged in a pattern identical to the patterns of the flex pads 24 of the first set and the flex pads 25 of the second set. The conductive contacts 36 of one of the integrated circuit chip packages 28 are electrically connected to respective ones of the flex pads 24 of the first set, with the conductive contacts 36 of the remaining integrated circuit chip package 28 being electrically connected to respective ones of the flex pads 25 of the second set. Such electrical connection is preferably accomplished via soldering. Each of the integrated circuit chip packages 28 is preferably a CSP (chip scale package) device such as a BGA (ball grid array) device, a fine pitch BGA device, or a flip chip device.

In assembling the chip stack 10, the integrated circuit chip packages 28 are electrically connected to the first conductive pattern of the flex circuit 12 in the above-described manner. As further seen in FIG. 1, a layer 38 of flux/underfill material may optionally be applied between the bottom surfaces 34 of the package bodies 30 and respective ones of the top and bottom surfaces 16, 18 of the flex substrate 14. The leads 26 are sized relative to the integrated circuit chip packages 28 such that the outwardly turned distal end of each lead 26 extends beyond the top surface 32 of the lowermost integrated circuit chip package 28 of the chip stack 10 (i.e., the integrated circuit chip package 28 disposed on the bottom surface 18 and electrically connected to the flex pads 25 of the second set). Thus, when the chip stack 10 is mounted or electrically connected to an underlying component such as a printed circuit board (PCB) through the use of the leads 26 thereof, a slight gap is defined between the top surface 32 of the lowermost integrated circuit chip package 28 of the chip stack 10 and the printed circuit board 40.

Those of ordinary skill in the art will recognize that the number and orientation/pattern of leads 26 extending from the flex substrate 14 is dependent upon the desired "footprint" of the chip stack 10. In this regard, it is not necessary that the leads 26 protrude from each of the longitudinal and lateral peripheral edge segments 20, 22 of the flex substrate 14. For example, the leads 28 may extend from only each of the longitudinal peripheral edge segments 20, or each of the lateral peripheral edge segments 22. Additionally, the leads 26 may extend from one longitudinal peripheral edge segment 20 and/or one lateral peripheral edge segment 22. Moreover, the leads 26 need not necessarily be provided in a continuous row along any longitudinal or lateral peripheral edge segment 20, 22 of the flex substrate 14.

Figure 3:
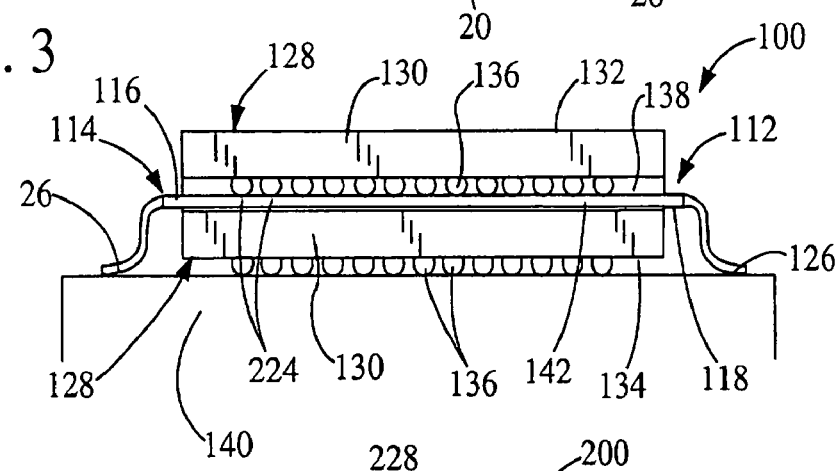
FIG. 3 is a side-elevational view of a chip stack constructed in accordance with a second embodiment of the present invention.

Referring now to FIG. 3, there is shown a chip stack 100 which is constructed in accordance with a second embodiment of the present invention. The chip stack 100 comprises a flex circuit 112 which is identical to the flex circuit 12 of the chip stack 10 in almost all respects, except that the flex circuit 112 of the chip stack 100 does not include the second set of flex pads 25 described above. Thus, the first conductive pattern of the flex circuit 112 comprises only the first set of flex pads 224 disposed in a generally rectangular pattern or array in the central portion of the top surface 116 of the flex substrate 114. In the flex circuit 112, the leads 126 thereof are electrically connected to respective ones of the flex pads 224 of the first set via conductive traces which extend within the flex substrate 114. It is contemplated that the conductive traces may be arranged in a pattern such that two or more of the flex pads 224 of the first set may be electrically connected to a single lead 126.

The chip stack 100 of the second embodiment further comprises two identically configured integrated circuit chip packages 128 which are identical to the integrated circuit chip packages 28 of the chip stack 10, and each preferably comprises a rectangularly configured package body 130 having a plurality of conductive contacts 136 disposed on the bottom surface 134 thereof. Like the integrated circuit chip packages 28, each of the integrated circuit chip packages 128 preferably comprises a CSP device such as a BGA device, a fine pitch BGA device, or a flip chip device.

In the chip stack 100 of the second embodiment, one of the integrated circuit chip packages 128 is electrically connected to the first conductive pattern of the flex circuit 112. More particularly, the conductive contacts 136 of one of the integrated circuit chip packages 128 are electrically connected to respective ones of the flex pads 224 of the first set. The conductive contacts 136 and flex pads 124 are preferably arranged in identical patterns. The remaining integrated circuit chip package 128 in the chip stack 100 (i.e., the lowermost integrated circuit chip package 128 in the chip stack 100) is attached to the bottom surface 118 of the flex substrate 114 of the flex circuit 112. More particularly, the top surface 132 of the package body 130 of the lowermost integrated circuit chip package 128 is rigidly affixed to the bottom surface 118 via an adhesive layer 142. As seen in FIG. 3, the leads 126 of the flex circuit 112 and integrated circuit chip packages 128 are preferably sized relative to each other such that the outwardly turned distal ends of the leads 126 and the conductive contacts 136 of the lowermost integrated circuit chip package 128 (which is adhesively affixed to the bottom surface 118 of the flex substrate 114) extend in substantially coplanar relation to each other. Thus, in the chip stack 100 of the second embodiment, the leads 126 and conductive contacts 136 collectively define a composite footprint (ball and lead) for the chip stack 100 which is electrically connectable to an underlying component such as a printed circuit board 140.

The chip stack 100 of the second embodiment is preferably assembled by initially electrically connecting one of the integrated circuit chip packages 128 to the first conductive pattern of the flex circuit 112 in the above-described manner. Thereafter, the remaining integrated circuit chip package 128 is secured to the bottom surface 118 of the flex substrate 114 in the above-described manner. Those of ordinary skill in the art will recognize that an assembly sequence varying from that described above may be employed for use in relation to the chip stack 100 of the second embodiment. Additionally, if desired, a layer 138 of flux/underfill material may be applied between the bottom surface 134 of the uppermost integrated circuit chip package 128 and the top surface 116 of the flex substrate 114 of the flex circuit 112.

Figure 4:
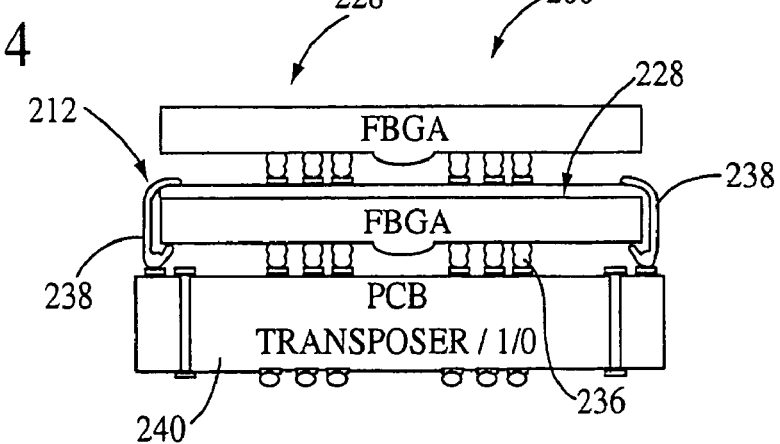
FIG. 4 is a side-elevational view of a chip stack constructed in accordance with a third embodiment of the present invention.

Referring now to FIG. 4, there is depicted a chip stack 200 constructed in accordance with a third embodiment of the present invention. The chip stack 200 of the third embodiment is virtually identical to the chip stack 100 of the second embodiment, with the exception that the leads 238 of the flex circuit 212 of the chip stack 200, each comprise a J-lead having a generally J shape as opposed to the S-leads shown and described in relation to the flex circuit 112. In the chip stack 200, the leads 238 and integrated circuit chip packages 228 are sized and configured relative to each other such that the inwardly turned distal ends of the leads 238 and the conductive contacts 236 of the lowermost integrated circuit chip package 228 extend in substantially co-planar relation to each other so as to collectively define a composite footprint (ball and lead) for the chip stack 200 which is electrically connectable to an underlying component such as a printed circuit board 240.

Those of ordinary skill in the art will recognize that, though not shown, each of the leads 26 of the chip stack 10 may alternatively be configured as a J-lead as opposed to an S-lead. Additionally, the leads 26 of the chip stack 10, as well as the leads 126 of the chip stack 100, may alternatively be configured as gull-wing leads as opposed to S-leads. It is contemplated that in each embodiment of the present chip stack, the flex circuit will initially be formed such that a plurality of metal tabs extend linearly from the longitudinal peripheral edge segment(s) and/or lateral peripheral edge segment(s) thereof. Subsequent to the electrical connection/adhesive attachment of the integrated circuit chip packages to the flex circuit, these linearly extending metal tabs can be bent or otherwise formed into the leads. As indicated above, the leads of any embodiment of the chip stack of the present invention may be formed into a J, S, or gull-wing shape.

Additional modifications and improvements of the present invention may also be apparent to those of ordinary skill in the art. Thus, the particular combination of parts described and illustrated herein is intended to represent only certain embodiments of the present invention, and is not intended to serve as limitations of alternative devices within the spirit and scope of the invention.

What is claimed is:

1. A chip stack comprising:
    a flex circuit comprising:
        a flex substrate;
        a first conductive pattern disposed on the flex substrate; and
        a plurality of flex pads electrically connected to the first conductive pattern;
        two integrated circuit devices electrically connected to the first conductive pattern and disposed one above the other.

2. The chip stack of claim 1 in which the two integrated circuit devices are disposed on opposite sides of the flex substrate.

3. The chip stack of claim 1 in which conductive contacts of a first one of the two integrated circuit devices are attached to the plurality of flex pads.

4. The chip stack of claim 1 in which the first conductive pattern comprises a first set of flex pads and a second set of flex pads.

5. The chip stack of claim 1 in which a first one of the two integrated circuit devices is a flip-chip device.

6. The chip stack of claim 1 in which the conductive contacts of a first one of the two integrated circuit devices are BGA contacts.

* * * * *

UNITED STATES PATENT AND TRADEMARK OFFICE
CERTIFICATE OF CORRECTION

PATENT NO. : 7,193,310 B2 Page 1 of 1
APPLICATION NO. : 11/489956
DATED : March 20, 2007
INVENTOR(S) : Glen E. Roeters and Andrew C. Ross It is certified that error appears in the above-identified patent and that said Letters Patent is hereby corrected as shown below:

Title Page; item (73)

Assignee: please change Stuktek Group, L.P. to Staktek Group L.P.

Signed and Sealed this

Third Day of July, 2007

JON W. DUDAS
*Director of the United States Patent and Trademark Office*